United States Patent
Sinha et al.

[11] Patent Number: 6,123,765
[45] Date of Patent: Sep. 26, 2000

[54] CONTINUOUSLY FED SINGLE BUBBLER FOR EPITAXIAL DEPOSITION OF SILICON

[75] Inventors: Drew Sinha, Salem; Jack Harlan Coker, Keizer; Subramania Krishnakumar, Salem, all of Oreg.

[73] Assignee: Mitsubishi Silicon America, Salem, Oreg.

[21] Appl. No.: 09/049,537

[22] Filed: Mar. 27, 1998

[51] Int. Cl.[7] .............................. C30B 23/00; B65B 1/30
[52] U.S. Cl. .............................. 117/84; 117/86; 117/202; 118/726; 137/386; 141/83; 141/198; 222/58; 261/126
[58] Field of Search ............................ 117/202, 86, 84; 137/403; 222/58; 141/83, 95, 198; 118/726; 261/126, DIG. 65, 142

[56] References Cited

U.S. PATENT DOCUMENTS

| | | | |
|---|---|---|---|
| 4,615,720 | 10/1986 | Dunn et al. | 65/29.16 |
| 4,979,545 | 12/1990 | Fair | 141/83 |
| 5,078,922 | 1/1992 | Collins et al. | 261/139 |
| 5,219,224 | 6/1993 | Pratt | 366/141 |
| 5,335,185 | 8/1994 | Pitts et al. | 364/528.17 |
| 5,402,834 | 4/1995 | Levin et al. | 141/83 |
| 5,669,250 | 9/1997 | Dausch et al. | 68/12.02 |
| 5,878,793 | 3/1999 | Siegele et al. | 141/63 |

Primary Examiner—Benjamin L. Utech
Assistant Examiner—Donald L. Champagne
Attorney, Agent, or Firm—Flehr Hohbach Test Albritton & Herbert

[57] ABSTRACT

A delivery system and method for providing a gaseous chemical is provided. The system comprises a single bubbler 12 having a chamber 13 for containing a liquid chemical, at least one inlet tube 14 for providing a carrier gas to said chamber, and one outlet tube 16 for providing the gaseous chemical. A liquid chemical supply line 25 conveys the liquid chemical to said chamber. A bubbler is in contact with weight measuring device 24 for weighing the bubbler and generating an output signal responsive to the measured weight. A liquid chemical controller 20 is operatively coupled to said bubbler and said supply line for filling and continuously maintaining a preselected level of the liquid chemical in said chamber responsive to said output signal.

12 Claims, 4 Drawing Sheets

Schematic of the single-bubble TCS delivery system.

Schematic of the single-bubble TCS delivery system.

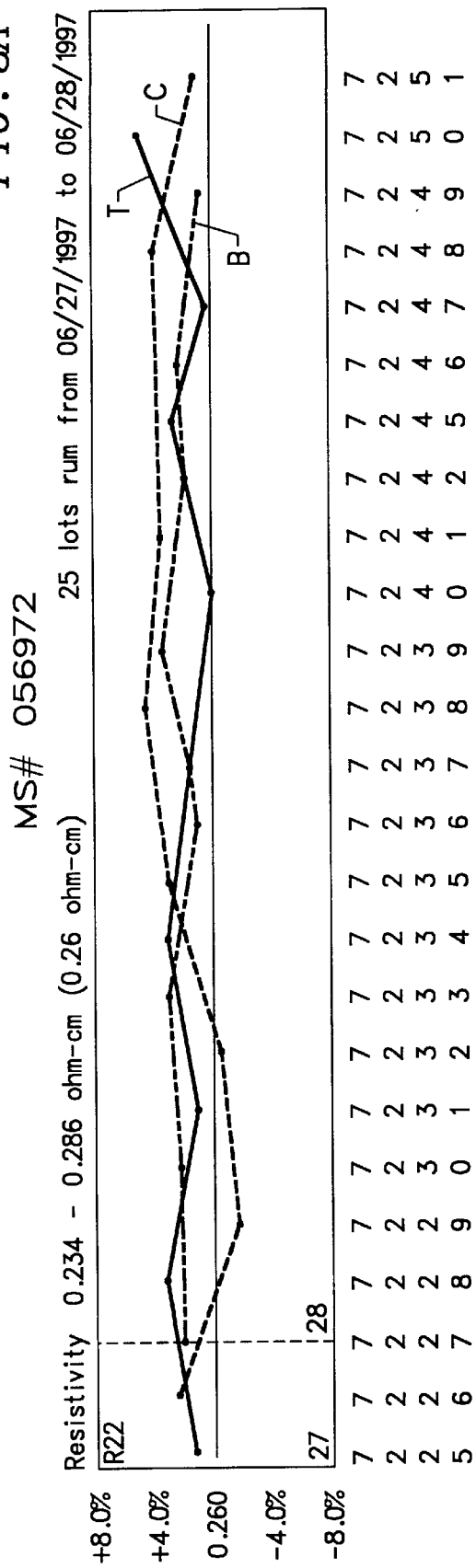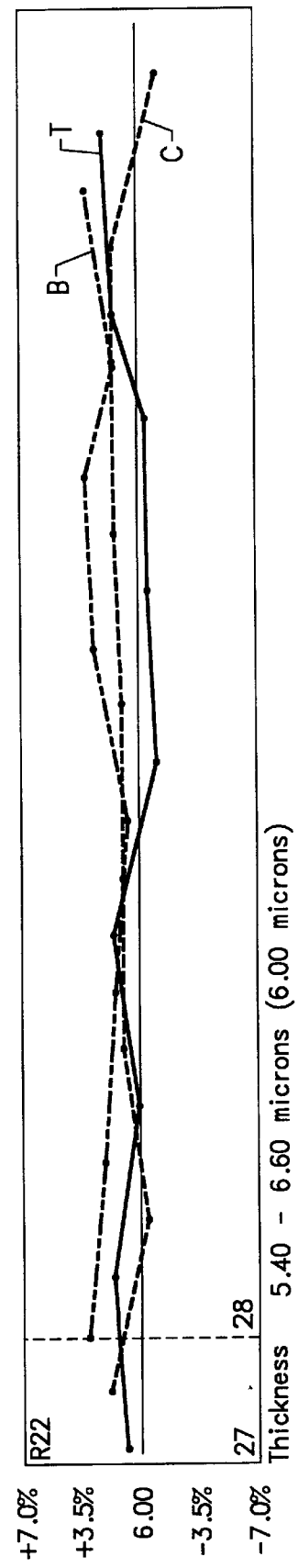

CONTINUOUSLY FED SINGLE BUBBLER FOR EPITAXIAL DEPOSITION OF SILICON

FIELD OF THE INVENTION

The present invention relates to a delivery system and method for providing a gaseous chemical. More particularly the invention relates to a delivery system and method using a continuously fed, single bubbler for supplying gaseous chemicals for epitaxial deposition of silicon.

BACKGROUND OF THE INVENTION

Bubblers are used in a variety of industries to supply gaseous chemicals. Typically, the bubbler includes a carrier gas inlet tube that is immersed in a liquid chemical. The tube usually has a single gas outlet positioned near the bottom level of the liquid chemical so that a single stream of carrier gas bubbles through the liquid chemical. Some of the liquid chemical is vaporized by the carrier gas to form the gaseous chemical.

In the semiconductor industry, bubblers are used to provide a variety of gaseous chemicals for semiconductor fabrication and processing. For example, bubblers are used to provide chemicals such as gaseous trichlorosilane for epitaxial deposition of single crystal silicon. The standard bubbler system used in the industry is a dual bubbler system. The dual bubbler system utilizes two bubblers that operates as a batch process. That is, one bubbler is the lead and the other is the lag bubbler. The lag bubbler is used first, and when the weight of the liquid in the lag bubbler drops to a certain level, it is taken off line and is being replaced with a filled new bubbler. However, the role of lead and lag bubbler is reversed following the bubbler replacement. The empty bubbler is sent to a chemical company for subsequent cleaning and filling with liquid chemical.

The dual bubbler system has many limitations. It is expensive to operate, being prone to high maintenance and material costs. Environmental costs are required to dispose of residual chemical in the system after each batch. The dual system increases exposure to chemical hazards since the system must be dismantled and cleaned. Cycle times of the system are increased since the dual bubbler system must be taken off line at the end of its batch. Moreover, the dual bubbler system has performance limitations. Contaminants concentrate in the bottom of the lag bubbler and can be carried out into the semiconductor system and increase the risk of process contamination. Further, as the liquid level drops during batch operation of the dual bubbler system, certain bubbler components comprised of metal, such as iron, can leach into the chemical liquid and such metals can be carried out and contaminate the semiconductor process. Thus, it is desirable to provide a bubbler system which is not subject to the foregoing limitations.

OBJECTS AND SUMMARY OF THE INVENTION

Accordingly, it is an object of the present invention to provide an improved delivery system and method for providing a gaseous chemical.

More particularly, it is an object of the present invention to provide a delivery system and method using a single bubbler for supplying gaseous chemicals for semiconductor processing.

It is another object of the present invention to provide a single bubbler system that is a continuous feed system.

A further object of the invention is to provide a bubbler system and method that reduces costs, improves performance, and eliminates cycle time caused by bubbler replacement.

These and other objects are provided by a delivery system for vaporizing a chemical liquid in accordance with the present invention. The delivery system includes a single bubbler having a chamber for containing a liquid chemical, with at least one inlet tube for providing a carrier gas to the chamber. The system also includes a liquid chemical supply line for conveying the liquid chemical to said chamber. The carrier gas is bubbled through the liquid chemical to create the gaseous chemical which is supplied via an outlet tube. A weight measuring device is provided for weighing the bubbler and generating an output signal responsive to the measured weight. A liquid chemical controller is operatively coupled to the bubbler and supply line for filling and continuously maintaining a preselected level of the liquid chemical in said bubbler responsive to said output signal and thus providing a gaseous chemical by bubbling a carrier gas through the liquid chemical.

BRIEF DESCRIPTION OF THE DRAWINGS

Other objects and advantages of the invention become apparent upon reading of the detailed description of the invention and the appended claims provided below, and upon reference to the drawings in which:

FIGS. 3a and 3b illustrate resistivity and thickness measurements, respectively, from wafers fabricated using the single bubbler system of the present invention.

DETAIL DESCRIPTION OF THE INVENTION

Figure 1:
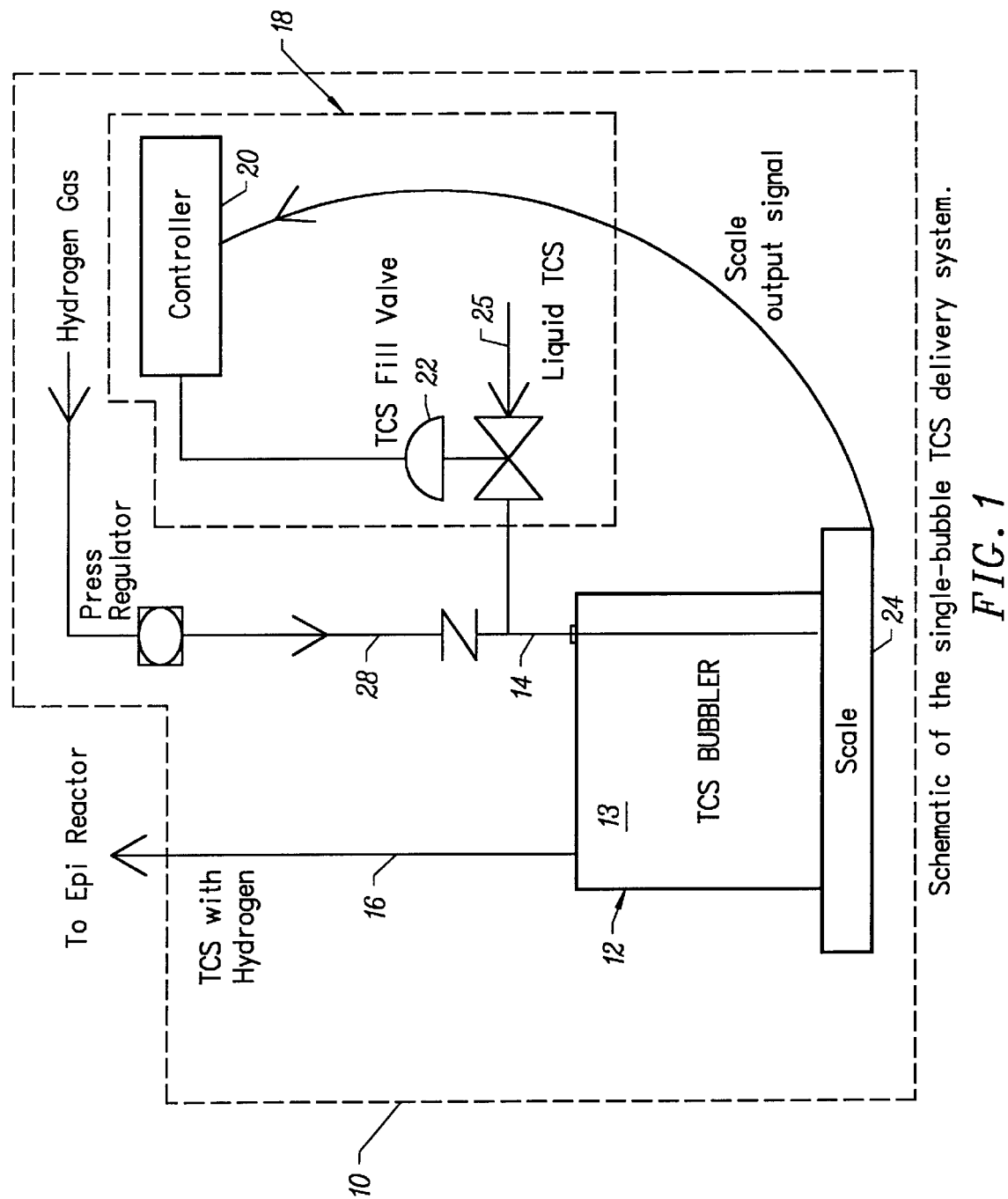
FIG. 1 is a schematic drawing of a delivery system employing a single bubbler in accordance with the present invention.

Turning to the drawings, wherein like components are designated by like reference numbers in the figures, FIG. 1 shows a delivery system 10 in accordance with the present invention. The delivery system 10 includes a single bubbler 12 for vaporizing a liquid chemical. The liquid chemical is vaporized by bubbling a carrier gas though the liquid chemical. Specifically, the bubbler 12 comprises a chamber 13 for containing the liquid chemical. An inlet tube 14 is connected through the top of the bubbler chamber 13 and extends through the chamber such that the end of the inlet tube 14 is positioned adjacent the bottom of the chamber 13. An outlet tube 16 is connected to the top of the bubbler chamber 13 for supplying the vaporized chemical to a semiconductor apparatus, in this case to an epitaxial reactor (not shown). In the exemplary embodiment shown in FIG. 1, only one inlet tube 14 is provided which supplies both the liquid chemical and a carrier gas to the bubbler chamber 13. However, a bubbler system with more than one inlet tube may be used.

Of particular advantage, the bubbler system of the present invention provides for the continuous feed of the liquid chemical to the bubbler chamber 13 via liquid chemical control system 18. The liquid chemical control system 18 includes a controller 20 operatively coupled to a fill valve 22 which is located upstream of the bubbler 12. The flow of liquid chemical is regulated by the fill valve 22. The level of liquid chemical in the bubbler chamber 13 is indicated by a weight scale 24. The bubbler is placed on the weight scale 24 and the scale 24 monitors the weight of the liquid chemical in the bubbler chamber 13. Specifically, the weight scale 24 generates a scale output signal representing the weight of the bubbler and sends this output signal to the controller 20. The controller is programed to receive the scale output signal and compare it to a preselected value, and generate a control signal responsive thereto. When the output signal is below this preselected value, the controller sends a signal to the fill valve to open and provide liquid chemical to the bubbler chamber 13. The liquid chemical is provided by supply line 25 which is connected to a bulk chemical storage tank (not shown). The fill valve 22 is open until the controller sends a signal to close when the preselected value is reached. Thus, a continuous feed back control loop is provided that allows continuous replacement of the liquid chemical to the bubbler chamber 13.

To operate the bubbler system 10, the chamber 13 is first filled with a chemical liquid via inlet tube 14. The chamber is filled until the controller 20 signals the fill valve 22 to close. Next, a carrier gas, normally hydrogen, is supplied to the bubbler chamber 13 via inlet tube 14. Alternatively, the chemical liquid and carrier gas may be supplied to the bubbler at the same time. The carrier gas is conveyed to the inlet tube 14 via a regulated supply line 26. The regulated line 26 contains a check valve 28 to prevent the back flow of liquid chemical into the line 26. Preferably, pressure regulator 30 is also placed in the line 26 to supply the carrier gas at a lower pressure than the liquid chemical supply pressure for continuous operation of the fill process. Generally, the hydrogen pressure will be in a range of approximately 22 to 40 psi. Preferably, during filling, the pressure of the chemical liquid is 5 to 10 psi greater than the hydrogen pressure. The temperature of the liquid chemical in the bubbler chamber 13 is preferably maintained in a range of approximately 64 to 65° F. The present invention eliminates any need for venting as required by the dual bubbler systems of the prior art which operate in a batch filling mode.

Carrier gas is bubbled into the bubbler chamber via inlet tube 14. The liquid chemical is vaporized in the following manner. The principle of the bubbler operation is governed by the mass transfer between gas and liquid phases as well as by Henry's law for gas dissolution. In the exemplary embodiment, hydrogen is used as the carrier gas and trichlorosilane (TCS) is used as the liquid chemical. It is to be understood that other carrier gases and liquid chemicals may be used with the system and method of the present invention. Hydrogen gas bubbles are fed to the bottom of the bubbler chamber 13 via the inlet tube 14. Preferably, the inlet tube 14 is made of ¼" stainless steel tubing. The diffusion of TCS in hydrogen is governed by the partial pressure difference of TCS between the liquid and the gas. The steady state mass balance for transfer of TCS in the vapor phase can be expressed as:

$$N_{(tcs)} = K_g(P^0 - P)$$

where $K_g$ is the mass transfer coefficient for the vapor phase; $P^0$ is the vapor pressure of the liquid TCS at the operating temperature; and P is the partial pressure of TCS in hydrogen.

The rising hydrogen gas bubbles reduce the partial pressure of TCS compared to the saturated liquid and causes diffusion of TCS from the liquid to the gas phase. The equilibrium concentration of the TCS in hydrogen is obtained by optimizing the operating pressure and temperature based on the process need. The saturation concentration of TCS in hydrogen decreases with increasing hydrogen pressure and vice versa. However, the saturation concentration of TCS in hydrogen increases or decreases with an increase or decrease in temperature, respectively. The equilibrium saturation of hydrogen with TCS is maintained at the desired levels by operating the bubbler system of the present invention under the following conditions:

(1) a liquid TCS level (about 90% of the bubbler capacity) is maintained inside the bubbler chamber 13 with the continuous fill operation. This high level of liquid TCS allows a small vapor space inside the bubbler and ensures saturation and pressure stability;

(2) This stability in pressure provides better control of flow of TCS gas and improves the utilization of the TCS for Epitaxial silicon deposition process; and (3) a nearly filled bubbler of TCS provides a large thermal mass and prevents any temperature increase caused by heat of dissolution of gases.

Combination of these three conditions in the present invention provides a delivery system with improved stability in the growth rate of the epitaxial silicon and increases the product purity while reducing the cost of the single crystal silicon epitaxial deposition process.

Figure 2:
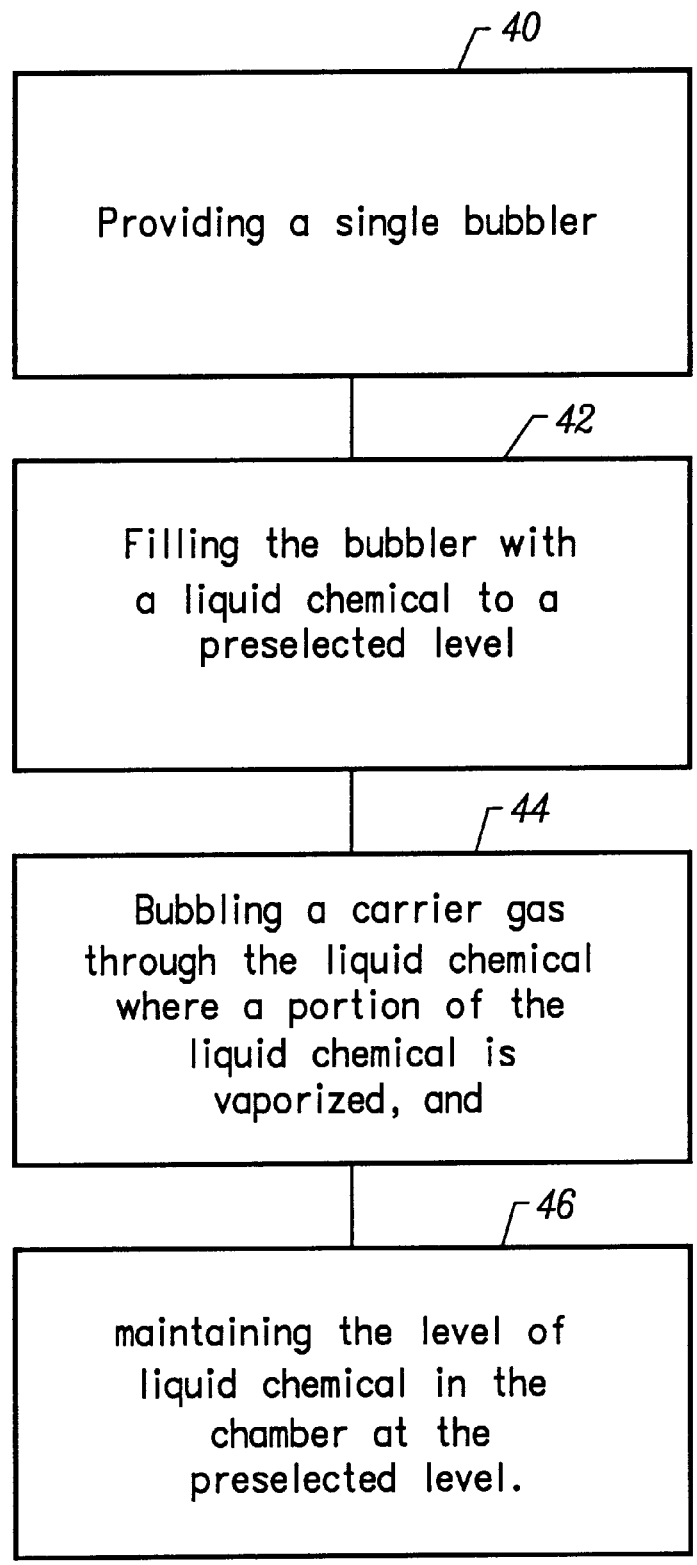
FIG. 2 is a flowchart of the method steps in accordance with the present invention.

A method of delivering a vaporized chemical to an epitaxial reactor for deposition of silicon in accordance with the present invention is shown in FIG. 2. The method comprises the following steps. First at step 40 a single bubbler comprised of a chamber, and at least one inlet for conveying a carrier gas to said chamber and outlet tube is provided. Next, at 42 the chamber is filled with a liquid chemical to a preselected level. A carrier gas is then bubbled through the liquid chemical at step 44. As described above a portion of the liquid chemical is vaporized and carried out of the bubbler through the outlet tube. Of particular advantage the method provides for maintaining the level of the liquid chemical in the chamber at the preselected level at step 46.

EXPERIMENTAL

A number of experiments were performed to evaluate the stability in the growth rate of silicon epi-layers deposited using a delivery system in accordance with the present invention. The stability in saturation of the TCS vaporized flow directly relates to the stability of the growth rate of the deposited silicon epi-layers in the epitaxial reactor. FIGS. 3a and 3b illustrate resistivity and thickness data, respectively, measured on wafers fabricated in an epitaxial reactor using the single bubbler system of the present invention. A series of three measurements were made representing the resistivity and thickness of epi-layers fabricated on wafers placed at three locations within the reactor; namely, across the top, center and bottom zone of the reactor. Each of the series of measurements is made with a single wafer placed at the appropriate zone. A total of 25 wafers were tested, thereby providing 25 measurement points. The top, center and bottom zone measurements are represented by lines "T," "C," and "B," respectively, on FIGS. 3a and 3b.

Figures 4A, 4B:
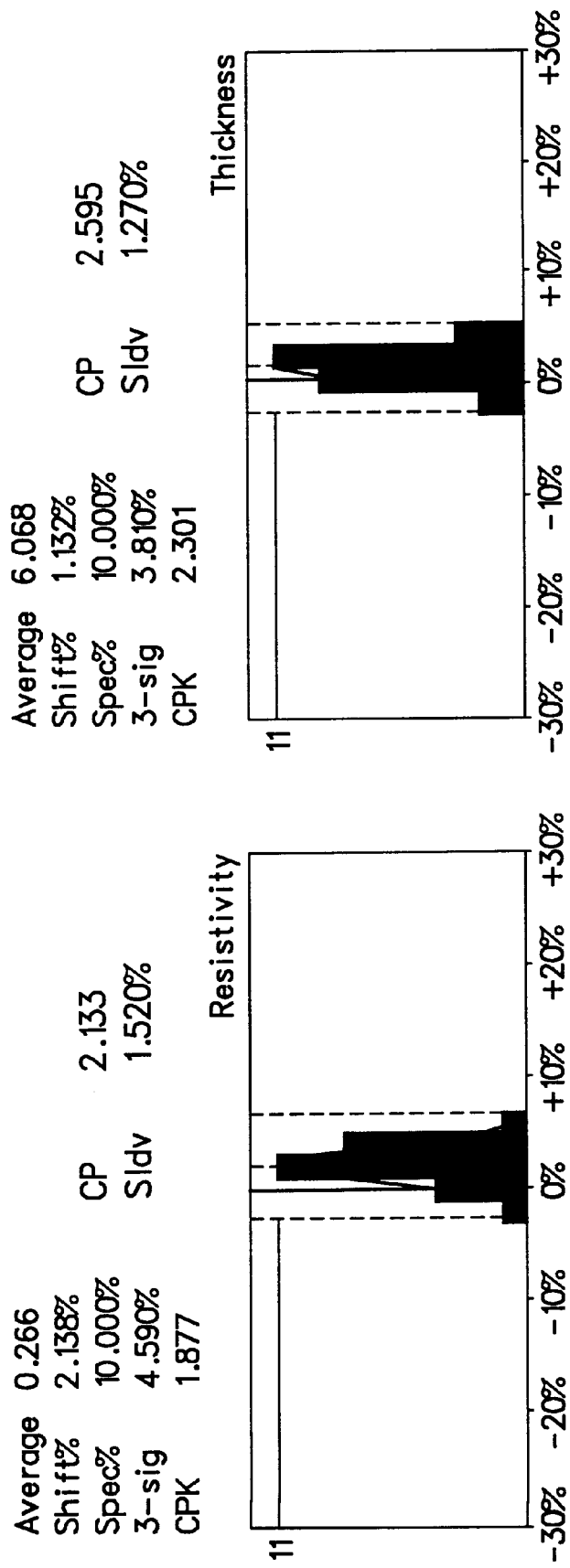
FIGS. 4a and 4b show the standard deviation of the resistivity and thickness measurements, respectively of the data in FIGS. 3a and 3b.

FIGS. 4a and 4b show the standard deviation of the resistivity and thickness measurements, respectively, of the data in FIGS. 3a and 3b. The resistivity has a standard deviation of 1.530%, and the thickness has a standard deviation of 1.270%, which indicates good uniformity across the wafer. As shown, the system and method of the present invention deposit epi-layers on silicon wafers having desirable resistivity and thickness uniformity.

The epitaxial layers grown on wafers using the system and method of the present invention were tested for iron concentration. As discussed above, iron may leach from the bubbler components during operation and end up as contaminants in the deposited film. This is sometimes a problem with the prior art dual bubbler systems. Layers grown using a conventional prior art dual bubbler system were tested and found to have an average iron concentration of $3.5 \times 10^{12}$ atoms/cm$^2$. Layers grown using the present invention have an average iron concentration of $2.0 \times 10^{12}$ atoms/cm$^2$, a beneficial improvement.

The foregoing description of specific embodiments of the invention have been presented for the purpose of illustration and description. They are not intended to be exhaustive or to limit the invention to the precise forms disclosed, and many modifications, embodiments, and variations are possible in light of the above teaching. It is intended that the scope of the invention be defined by the Claims appended hereto and their equivalents.

What is claimed:

1. A delivery system for providing a gaseous chemical in semiconductor industry applications by bubbling a carrier gas through a liquid chemical, comprising:

a single bubbler having a chamber for containing the liquid chemical, at least one inlet tube for providing a carrier gas to said chamber, and one outlet tube for providing the gaseous chemical;

a liquid chemical supply line for conveying the liquid chemical to said chamber;

a weight measuring device for weighing the bubbler and generating an output signal responsive to the measured weight; and a liquid chemical controller operatively coupled to said bubbler and said supply line for filling and continuously maintaining a level of the liquid chemical in said chamber responsive to said output signal, wherein the level of the liquid chemical in the chamber is at approximately 90% of the volume of the chamber which promotes equilibrium saturation of the carrier gas with the liquid chemical.

2. The system of claim 1 wherein said liquid chemical is trichlorosilane.

3. The system of claim 1 wherein the carrier gas is provided at a pressure in the range of approximately 22 to 40 psi.

4. The system of claim 1 wherein the liquid chemical is provided at a pressure greater than the pressure of the carrier gas.

5. The system of claim 1 wherein the gaseous chemical provided by said one outlet tube is at a flow rate in the range of approximately 25 slm to 60 slm.

6. A bubbler system for vaporizing a liquid chemical in semiconductor industry applications by bubbling a carrier gas though the liquid chemical characterized in that the system includes a single bubbler and a controller for filling and continuously maintaining a level of the liquid chemical in said bubbler to be vaporized at the level of approximately 90% of the volume of the chamber which promotes equilibrium saturation of the carrier gas with the liquid chemical.

7. A method of delivering a vaporized chemical in semiconductor industry applications, comprising the steps of:

providing a single bubbler having a chamber and at least one inlet for conveying a carrier gas to said chamber, and an outlet tube;

filling said chamber with a liquid chemical to a level;

bubbling a carrier gas through said liquid chemical whereby a portion of the liquid chemical is vaporized; and maintaining the level of the liquid chemical in said chamber at approximately 90% of the volume of the chamber which promotes equilibrium saturation of the carrier gas with the liquid chemical.

8. The method of claim 7 wherein said liquid chemical is trichlorosilane.

9. The method of claim 7 wherein the carrier gas is bubbled at a pressure in the range of approximately 22 to 40 psi.

10. The method of claim 7 wherein the liquid chemical is provided at a pressure greater than the pressure of the carrier gas.

11. The method of claim 7 wherein the gaseous chemical provided by said one outlet tube is at a flow rate in the range of approximately 25 slm to 60 slm.

12. The method of claim 7 further comprising the step of delivering said gaseous chemical to an epitaxial reactor for processing of semiconductor wafers.

* * * * *